United States Patent
Hsiao et al.

(10) Patent No.: US 9,020,015 B2
(45) Date of Patent: Apr. 28, 2015

(54) DIFFERENTIAL SIGNAL TRANSMISSION CIRCUIT

(71) Applicant: Novatek Microelectronics Corp., Hsinchu (TW)

(72) Inventors: Chiao-Wei Hsiao, Taichung (TW); Chia-Hsin Lin, Pingtung County (TW)

(73) Assignee: Novatek Microelectronics Corp., Hsinchu (TW)

( * ) Notice: Subject to any disclaimer, the term of this patent is extended or adjusted under 35 U.S.C. 154(b) by 247 days.

(21) Appl. No.: 13/668,318

(22) Filed: Nov. 5, 2012

(65) Prior Publication Data

US 2014/0064340 A1 Mar. 6, 2014

(30) Foreign Application Priority Data

Aug. 29, 2012 (TW) .............................. 101131371 A

(51) Int. Cl.

| | |
|---|---|
| H04B 3/46 | (2006.01) |
| H04B 17/00 | (2006.01) |
| H04B 1/38 | (2006.01) |
| H04B 1/40 | (2006.01) |
| G01R 31/3187 | (2006.01) |
| G01R 31/319 | (2006.01) |
| G01R 31/28 | (2006.01) |

(52) U.S. Cl.
CPC .............. *H04B 1/40* (2013.01); *G01R 31/3187* (2013.01); *G01R 31/31917* (2013.01); *G01R 31/2851* (2013.01)

(58) Field of Classification Search
CPC ........... G01R 31/2851; G01R 31/3187; G01R 31/31917; H04B 1/40
USPC .......... 375/219, 257, 259, 260, 224, 225, 227
See application file for complete search history.

(56) References Cited

U.S. PATENT DOCUMENTS

| 7,542,022 | B2 | 6/2009 | Park | |
|---|---|---|---|---|
| 2005/0156586 | A1* | 7/2005 | Kanbayashi | 324/76.53 |
| 2006/0067438 | A1* | 3/2006 | Menkhoff et al. | 375/343 |
| 2007/0296461 | A1* | 12/2007 | Wong et al. | 326/82 |

OTHER PUBLICATIONS

"Office Action of Taiwan Counterpart Application", issued on Oct. 17, 2014, p. 1-p. 6.

* cited by examiner

*Primary Examiner* — David B. Lugo
(74) *Attorney, Agent, or Firm* — Jianq Chyun IP Office

(57) ABSTRACT

A differential signal transmission circuit including a pattern generator, a low voltage differential signal (LVDS) transmitter, a transition minimized differential signal (TMDS) receiver, and a comparator is provided. The pattern generator generates a plurality of test data. The LVDS transmitter is coupled to the pattern generator to receive the test data, and generates a test output signal according to the test data. The TMDS receiver receives a test input signal to output a plurality of decoded data. The comparator is coupled to the TMDS receiver to receive the decoded data and the pattern generator to receive the test data. The comparator compares the decoded data with the test data to output a test result of the TMDS receiver.

16 Claims, 3 Drawing Sheets

DIFFERENTIAL SIGNAL TRANSMISSION CIRCUIT

CROSS-REFERENCE TO RELATED APPLICATION

This application claims the priority benefit of Taiwan application serial no. 101131371, filed on Aug. 29, 2012. The entirety of the above-mentioned patent application is hereby incorporated by reference herein and made a part of this specification.

BACKGROUND

1. Technical Field

The present invention is related to a differential signal transmission circuit, and particularly related to a differential signal transmission circuit having a self-test capability.

2. Description of Related Art

Along with rapid development of technology, the processing speed of the electronic apparatus increases continuously, and thus the signal frequency also increases. When the signal frequency becomes higher and higher, it is easier for signal to be affected and distorted by the noise. Since the differential signaling has the advantage of resisting noise, the differential signaling are usually selected for high frequency signal transmission.

Generally, the differential signals differ according to the data rate and voltage level (e.g., low voltage differential signal and transition minimized differential signal), and are utilized according to the design requirements of the signal transmission. Additionally, under different differential signals, a differential signal transmission circuit is utilized for conversion, so as to transmit data successfully without interruption.

Furthermore, in an electronic apparatus, each circuit is tested so as to increase the quality of the electronic apparatus. Additionally, a test of circuit is usually performed by utilizing test machines. For the test of a transition minimized differential signal receiver, the test machines are configured with the transition minimized differential signal receiver correspondingly, and then receives decoded data from the transition minimized differential signal receiver so as to verify whether or not the transition differential signal receiver operates correctly. However, there are relative costs to set up the test machines, and the costs of test machines are usually transferred to the electronic apparatus, and thus the manufacturing costs of the electronic apparatus is affected.

SUMMARY OF THE DISCLOSURE

The embodiment of the present invention set forth a differential signal transmission circuit having a capability to self-test whether or not the transition minimized differential signal receiver receives correctly, so as to omit the test machine to reduce the manufacturing costs.

The embodiment of the present invention set forth a differential signal transmission circuit, which includes a pattern generator, a low voltage differential signal (LVDS) transmitter, a transition minimized differential signal (TMDS) receiver, and a comparator. The pattern generator is configured to generate a plurality of test data. The LVDS transmitter is coupled to the pattern generator to receive the test data, and generates a test output signal according to the test data. The transition minimized differential signal receiver is configured to receive a test input signal, and outputs a plurality of decoded data. The comparator is coupled to the TMDS receiver to receive the decoded data, and is also coupled to the pattern generator to receive the test data. Wherein, the comparator compares the decoded data with the test data, so as to output a test result of the TMDS receiver.

According to an embodiment of the present invention, during a test period, the LVDS transmitter is coupled to the TMDS receiver, so that the test output signal is to be the test input signal.

The embodiment of the present invention set forth a differential signal transmission circuit, which includes a LVDS transmitter, a TMDS receiver, and a test circuit. The LVDS transmitter receives a plurality of test data, and generates a plurality of test output signals according to the test data. The TMDS receiver is configured to receive a plurality of test input signals, and outputs a plurality of decoded data. The test circuit is coupled to the LVDS transmitter to generate the test data to the LVDS transmitter, the test circuit is also coupled to the TMDS receiver to receive the decoded data, and outputs a test result of the TMDS receiver. During a test period, the LVDS transmitter may be coupled to the TMDS receiver, so that the test output signals are to be the test input signals.

According to an embodiment of the present invention, the test circuit includes a pattern generator and a comparator. The pattern generator is configured to generate the test data. The comparator is coupled to the TMDS receiver to receive the decoded data, and is also coupled to the pattern generator to receive the test data. The comparator compares the decoded data with the test data, so as to output a test result of the TMDS receiver.

The embodiment of the present invention set forth a differential signal transmission circuit, which includes a pattern generator, a LVDS transmitter, a TMDS receiver, and a comparator. The pattern generator is configured to generate a plurality of test data. The LVDS transmitter includes a parallel-to-serial converter and a transmitting driver. The parallel-to-serial converter is coupled to the pattern generator, which is configured to convert the test data into a serial signal. The transmitting driver is coupled to the parallel-to-serial converter to output a test output signal according to the serial signal. The TMDS receiver includes an analog front end (AFE) processor, a digital decimator, and a TMDS decoder. The analog front end processor receives a test input signal, and outputs a plurality of initial data. The digital decimator is coupled to the analog front end processor, and decimates the initial data to output a plurality of decimated data. The TMDS decoder is coupled to the digital decimator, so as to output the decoded data according to the decimated data. The comparator is coupled to the TMDS receiver to receive the decoded data, and coupled to the pattern generator to receive the test data. Wherein, the comparator compares the decoded data with the test data to output the test result of the TMDS receiver.

According to an embodiment of the present invention, the LVDS transmitter adjusts an effective number of input bits of the LVDS transmitter to conform to the TMDS.

According to an embodiment of the present invention, a data cycle of the test output signal is $2^n$ times of a typical TMDS, wherein n is an integer.

According to an embodiment of the present invention, the TMDS receiver adjusts a data capturing rate for the test input signal to conform to a data bit rate of the LVDS transmitter.

According to an embodiment of the present invention, the TMDS receiver adjusts the data capturing rate for the test input signal by removing part of repeated data of the test input signals.

According to an embodiment of the present invention, the LVDS transmitter includes a parallel-to-serial converter and a transmitting driver. The parallel-to-serial converter is coupled to the pattern generator, and is configured to convert the test data into a serial signal. The transmitting driver is coupled to the parallel-to-serial converter to output the test output signal according to the serial signal.

According to an embodiment of the present invention, the effective number of input bits of the parallel-to-serial converter is adjusted to correspond to the TMDS.

According to an embodiment of the present invention, the TMDS receiver includes an analog front end processor, a digital decimator, and a TMDS decoder. The analog front end processor receives a plurality of input signals, and outputs a plurality initial data. The digital decimator is coupled to the analog front end processor, and decimates the initial data to output a plurality of decimated data. The TMDS decoder is coupled to the digital decimator to output the decoded data according to the decimated data.

According to an embodiment of the present invention, during the decimation of the digital decimator, the repeated data within the initial data are removed.

According to an embodiment of the present invention, a number of the initial data is $2^n$ times of a number of the decimated data, wherein n is an integer.

According to an embodiment of the present invention, the TMDS receiver further includes a buffer, which is coupled between the digital decimator and the TMDS decoder, so as to reorganization the down-converted data.

According to an embodiment of the present invention, a data interval between each of the initial data captured by the digital decimator is the same.

Based on the above, in the differential signal transmission circuit according to the embodiment of the present invention, the LVDS transmitter receives the test data to output the test output signal. Furthermore, the TMDS receiver may receive the test input signal to output a plurality of decoded data. Next, the comparator compares the test data with the decoded data to output a test result of the TMDS receiver. Thus, a capability of self-testing of a differential signal transmission circuit is implemented, and test machines are omitted and the hardware cost of the TMDS receiver is reduced. That is, the manufacturing cost of the differential signal transmission circuit is reduced.

In order to make the aforementioned features and advantages of the present invention more comprehensible, embodiments accompanying figures are described in detail below.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the invention.

DESCRIPTION OF EMBODIMENT

Figure 1:
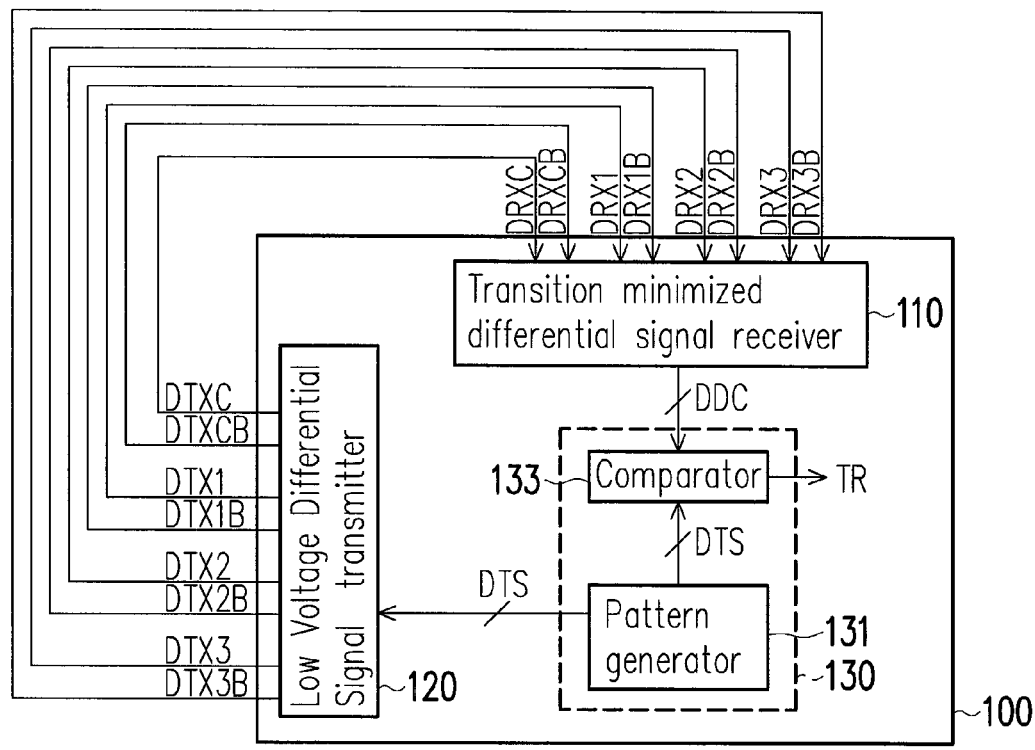
FIG. 1 is a diagram illustrating a system having a differential signal transmission circuit according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a diagram illustrating a system having a differential signal transmission circuit according to an embodiment of the present invention. With reference to FIG. 1, in the embodiment, a differential signal transmission circuit 100 includes a transition minimized differential signal (TMDS) receiver 110, a low voltage differential signal (LVDS) transmitter 120, and a test circuit 130. During a test period, the LVDS transmitter 120 may be coupled to the TMDS receiver 110.

The TMDS receiver 110 is configured to receive a clock input signal and a plurality of test input signals (three test input signals are referred to herein for example) and outputs a plurality of decoded data DDC. The clock input signal may be composed by a set of differential signals (e.g., DRXC and DRXCB), and the test input signals may also be respectively composed by a set of differential signals (e.g., DRX1, DRX1B, DRX2, DRX2B, DRX3, and DRX3B).

The LVDS transmitter 120 receives a plurality of test data DTS, and generates a clock output signal and a plurality of test output signals (three test output signals are referred to herein as example) according to the test data DTS. The clock output signal may be composed by a set of differential signals (e.g., DTXC and DTXCB), and the test output signals may be respectively composed by a set of differential signals (e.g., DTX1, DTX1B, DTX2, DTX2B, DTX3, and DTX3B).

The test circuit 130 is coupled to the LVDS transmitter 120 to generate the test data DTS to the LVDS transmitter 120. The test circuit 130 is also coupled to the TMDS receiver 110 to receive the decoded data DDC. The test circuit 130 determines whether or not the TMDS receiver 110 receives correctly according to the decoded data DDC, and accordingly outputs a test result TR of the TMDS receiver 110.

As described above, during a test period, the LVDS transmitter 120 may be coupled to the TMDS receiver 110. In other words, the clock output signal (e.g., DTXC and DTXCB) generated by the LVDS transmitter 120 and the test output signals (e.g., DTX1, DTX1B, DTX2, DTX2B, DTX3, and DTX3B) are transmitted to the TMDS receiver 110 to be the clock input signal (e.g., DRXC and DRXCB) and the test input signals (e.g., DTX1, DTX1B, DTX2, DTX2B, DTX3, and DTX3B).

In the embodiment, since the clock input signal (e.g., DRXC and DRXCB) and the test input signals (e.g., DTX1, DTX1B, DTX2, DTX2B, DTX3, and DTX3B) are generated according to the test data DTS, the decoded data DDC output by the TMDS receiver 110 should be identical as the test data DTS. Thus, the test circuit 130 may determine whether or not the TMDS receiver 110 receives correctly by comparing the decoded data DDC with the test data DTS.

The circuit configuration of the test circuit 130 according to an embodiment is illustrated in FIG. 1. In the embodiment, the test circuit 130 may includes a pattern generator 131 and a comparator 133. The pattern generator 131 is configured to generate the test data DTS. The comparator 133 is coupled to the TMDS receiver 110 to receive the decoded data DDC, and is coupled to the pattern generator 131 to receive the test data DTS. In addition, the comparator 133 compares the decoded data DDC with the test data DTS, and then outputs a comparison result as a test result TR of the TMDS receiver 110.

Generally, a voltage difference and a data bit rate of the TMDS is greater than the LVDS, and a ratio of serial-toparallel conversion of the TMDS receiver 110 (e.g., 1:10) does not correspond to a ratio of parallel-to-serial conversion of the LVDS transmitter (e.g., 7:1).

In the embodiment, in order to conform the clock output signal (e.g., DTXC and DTXCB) and the test output signals (e.g., DTX1, DTX1B, DTX2, DTX2B, DTX3, and DTX3B) to the ratio (e.g., 1:10) of serial-to-parallel conversion of the TMDS receiver 110, the LVDS transmitter 120 may adjust the effective number of input bits of the LVDS transmitter 120 to conform to the TMDS. That is, the ratio of parallel-to-serial conversion of LVDS 120 is increased to correspond to a specification of the TMDS (e.g., 10:1).

Additionally, the TMDS receiver 110 adjusts a data capturing rate of the clock input signal (e.g., DRXC and DRXCB) and the test input signals (e.g., DRX1, DRX1B, DRX2, DRX2B, DRX3, and DRX3B) to conform to the data bit rate of the LVDS transmitter 120.

For instance, if the data bit rate of the TMDS receiver 110 is configured as twice of the data bit rate of the LVDS transmitter 120, the data capturing rate of the TMDS 110 may be configured to ½, that is half decimating. If the data bit rate of the TMDS receiver 110 is configured as four times of the data bit rate of the LVDS transmitter 120, the data capturing rate of the TMDS receiver 110 may be configured to ¼, that is quarter decimating. The data capturing rate under other ratios may also be found accordingly.

In an embodiment of the present invention, the TMDS receiver 110 may adjust the data capturing rate of the test input signals (e.g., DRX1, DRX1B, DRX2, DRX2B, DRX3, and DRX3B) by removing part of repeated data of the test input signals (e.g., DRX1, DRX1B, DRX2, DRX2B, DRX3, and DRX3B). For instance, if the data bit rate of the TMDS receiver 110 is configured as twice of the data bit rate of the LVDS transmitter 120, data captured by the TMDS receiver 110 from the test input signals (e.g., DRX1, DRX1B, DRX2, DRX2B, DRX3, and DRX3B) will have a duplication data that repeated to each other. Therefore, one of the duplicated data may be removed to achieve the effect of adjusting data capturing rate. Similarly, if the data bit rate of the TMDS receiver 110 is configured as four times of the data bit rate of the LVDS transmitter 120, the data captured by the LVDS receiver 110 from the test input signals (e.g., DRX1, DRX1B, DRX2, DRX2B, DRX3, and DRX3B) will have three repetitions (that is, four data adjacent to each other are identical). Therefore, three out of four repetitive data can be removed, so as to achieve the effect of adjusting data capturing rate as well. The data capturing rate under other ratio may be found with aforementioned description. Furthermore, other signal processing method of adjusting the data capturing rate may be utilized, and the embodiment of the present invention is not limited thereto.

As discussed above, in the differential signal transmission circuit 100, the LVDS transmitter 120 may adjust the effective number of input bit of the LVDS transmitter 120 to conform to the TMDS, so as to generate the test input signals for the TMDS receiver 110 to receive. Furthermore, the TMDS receiver 110 may adjust the data capturing rate for the test input signals to conform to the data bit rate of the LVDS transmitter 120. Moreover, there is a test circuit 130 configured within the differential signal transmission circuit 100, for determining whether or not the TMDS receiver 110 receives correctly. Under the aforementioned configuration, the differential signal transmission circuit 100 may implement a self-test capability, and thus the costs of test by utilizing test machines can be omitted.

Figure 2:
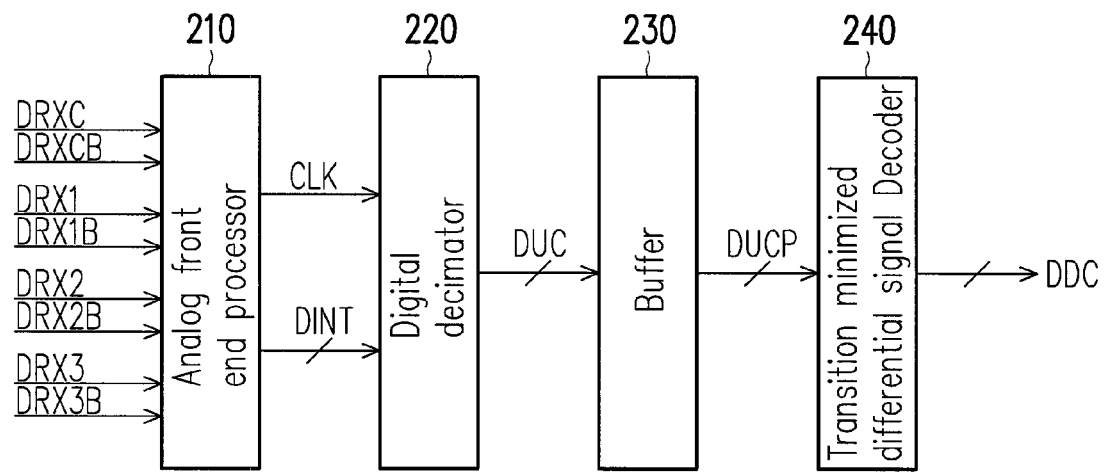
FIG. 2 is a diagram illustrating a system of a transition minimized differential signal (TMDS) receiver in FIG. 1 according to an embodiment of the preset invention.

FIG. 2 is a diagram illustrating a system of the TMDS receiver 110 in FIG. 1 according to an embodiment of the preset invention. With reference to FIG. 1 and FIG. 2, in the embodiment, the TMDS receiver 110 includes an analog front end (AFE) processor 210, a digital decimator 220, a buffer 240, and a TMDS decoder 240.

The analog front end processor 210 receives a clock input signal (e.g., DRXC and DRXCB) and the test input signals (e.g., DRX1, DRX1B, DRX2, DRX2B, DRX3, and DRX3B), and then correspondingly outputs a clock signal CLK and a plurality of initial data DINT. The digital decimator 220 is coupled to the analog front end processor 210, and decimates the initial data DINT to output a plurality of decimated data DUC. The buffer 230 is coupled to the digital decimator 220, which is configured to reorganize the decimated data DUC and then outputs a plurality of decimated data DUCP, wherein the decimated data DUCP is substantially identical to the decimated data DUC. The TMDS decoder 240 is coupled to the buffer 230, and outputs the decoded data DDC according to the decimated data DUCP.

It should be noted that in another embodiments of the present invention, the buffer 230 may be omitted. For example, if the TMDS decoder 240 has a reorganizing function, the buffer 230 may be omitted without affecting the data decoding. For instance, the TMDS decoder 240 may be connected to the digital decimator 220.

Figure 3A:
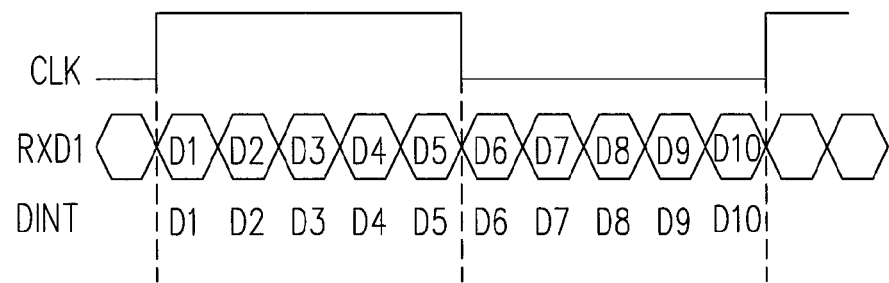
FIG. 3A is a timing diagram for receiving data of a typical TMDS according to an exemplary embodiment.

FIG. 3A is a timing diagram for receiving data of a typical TMDS according to an exemplary embodiment. With reference to FIGS. 2 and 3A, a waveform RXD1 illustrates a typical timing of data of the TMDS, and the ratio of serial-to-parallel conversion of the TMDS receiver 110 is herein configured to 1:10, that is, 10 data are transmitted within a clock cycle of the clock signal CLK (i.e., between two adjacent rising edges or two adjacent falling edges). Therefore, the typical TMDS transmits 10 data (e.g., D1-D10) within a clock cycle. If the analog front end processor 210 receives the typical TMDS, the analog front end processor 210 outputs 10 different initial data DINT within a clock cycle correspondingly.

Figure 3B:
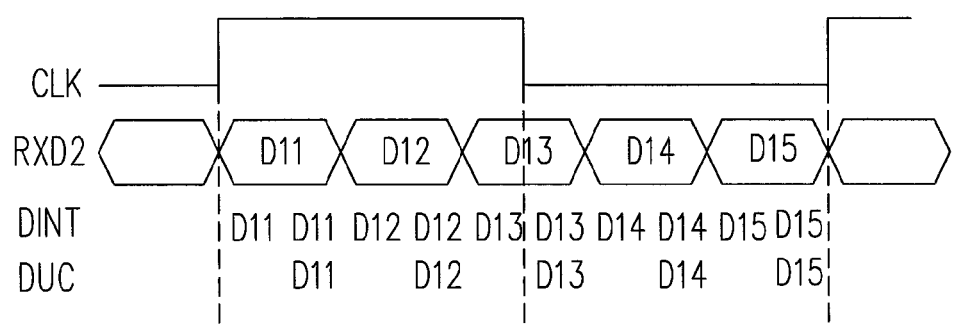
FIG. 3B and FIG. 3C are timing diagrams for receiving data of the TMDS according to an embodiment of the present invention.
Figure 3C:
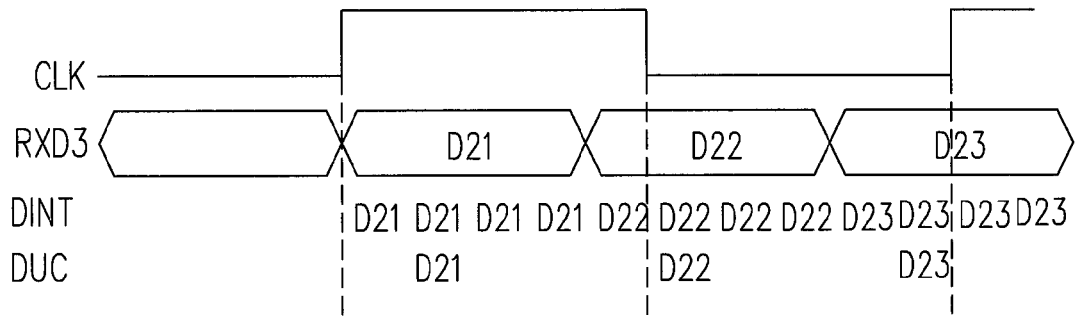

FIG. 3B and FIG. 3C are timing diagrams for receiving data of the TMDS according to an embodiment of the present invention. With reference to FIGS. 1, 2, and 3B, the data bit rate of the TMDS receiver 110 is herein configured as twice of the data bit rate of the LVDS transmitter 120, and a waveform WW2 is assumed to be a timing of the data of the test input signals (e.g., DRX1, DRX1B, DRX2, DRX2B, DRX3, and DRX3B). In the embodiment, the test input signals (e.g., DRX1, DRX1B, DRX2, DRX2B, DRX3, and DRX3B) transmit 5 data (e.g., D11-D15) within a clock cycle, that is, a data cycle (that is a transmission time of each data) of the test output signals (e.g., DRX1, DRX1B, DRX2, DRX2B, DRX3, and DRX3B) is twice of the typical TMDS (as illustrated in FIG. 3A).

The analog front end processor 210 similarly outputs 10 initial data DINT within a clock cycle; however, the initial data DINT have a duplication data DINT that repeats to each other. At the time, the digital decimator 220 performs decimation, and the digital decimator 220 removes the repeated data from the initial data DINT during decimation (herein, the former of two adjacent data that are repeated to each other is removed), and then outputs the initial data DINT that is not removed as the decimated data DUC. In another embodiment of the present invention, the latter of two adjacent data that are repeated to each other may be removed. There are more other methods of data removing according to the configuration of those skilled in the art, and the embodiment of the invention is not limited thereto.

Accordingly, in the embodiment, the number of the initial data DINT is twice of the number of the decimated data DUC.

Additionally, a data interval between each of the initial data DINT captured by the digital decimator 220 (that is, the initial data output by the digital decimator 220) is 1.

With reference to FIGS. 1, 2, and 3C, the data bit rate of the TMDS receiver 110 is configured as four times of the data bit rate of the LVDS transmitter 120, and a waveform RXD3 is assumed to be a timing of the data of the test input signals (e.g., DRX1, DRX1B, DRX2, DRX2B, DRX3, and DRX3B). In the embodiment, the test input signals (e.g., DRX1, DRX1B, DRX2, DRX2B, DRX3, and DRX3B) transmit 2.5 data within a clock cycle (e.g., D21-D23). That is, a data cycle (that is, the transmission time of each data) of the test output signals (e.g., DRX1, DRX1B, DRX2, DRX2B, DRX3, and DRX3B) is four times of the typical TMDS (as illustrated in FIG. 3A).

The analog front end processor 210 similarly outputs 10 initial data DINT within a clock cycle; however, the initial data DINT will have four repetitions of data that are adjacent to each other. At the time, the digital decimator 220 performs decimation, and the digital decimator 220 removes the repeated data within the initial data DINT during the decimation (herein, the first, third, and fourth repeated data for example are removed out of four repetitions of data that are adjacent to each other), and then outputs the initial data DINT that is not removed as the decimated data DUC. In another embodiment of the present invention, three out of the four repeated data that are adjacent to each other can be removed. There are other methods for removing data according to the configuration of those skilled in the art, and the embodiment of the present invention is not limited thereto.

Accordingly, in the embodiment, the number of the initial data DINT is four times of the number of the decimated data DUC. In addition, the data interval between each initial data DINT captured by the digital decimator 220 (that is, the initial data DINT output by the digital decimator 220) is 3.

According to the above embodiment, when the data bit rate of the TMDS receiver 110 is $2^n$ times of the data bit rate of the LVDS transmitter 120 (wherein n is an integer), the analog front end processor 210 outputs the initial data DINT which repeated every $2^n$ times of adjacent data. At the time, the digital decimator 220 may capture one of the initial data DINT that are repeated and adjacent to each other, and then remove the initial data DINT that are not captured so as to achieve a function of adjusting the data capturing rate. Wherein, the number of the initial data DINT is $2^n$ times of the number of the decimated data DUC.

Figure 4:
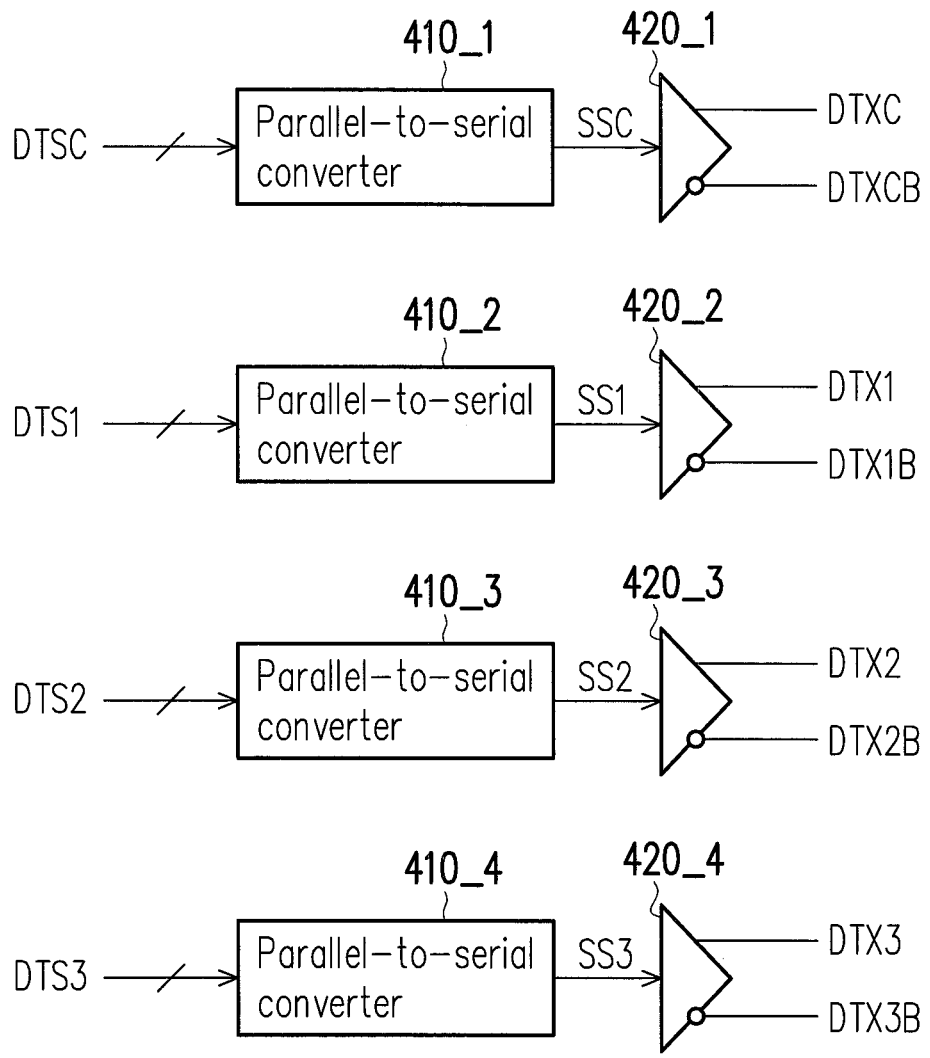
FIG. 4 is a diagram illustrating a system of a low voltage differential signal (LVDS) transmitter in FIG. 1 according to an embodiment of the present invention.

FIG. 4 is a diagram illustrating a system of the LVDS transmitter 120 in FIG. 1 according to an embodiment of the present invention. With reference to FIGS. 1 and 4, in the present embodiment, a LVDS transmitter 120 includes a plurality of parallel-to-serial converters (e.g., 410_1-410_4) and a plurality of transmitting drivers 120 (e.g., 420_1-420_4). Wherein, an effective number of input bits of the parallel-to-serial converter (e.g., 410_1-410_4) is adjusted to correspond to the TMDS (e.g., 10:1).

Furthermore, the parallel-to-serial converter 410_1 is coupled to the pattern generator 131 so as to receive a test data DTSC, and converts the test data DTSC into a serial signal SSC. The transmitting driver 420_1 is coupled to the parallel-to-serial converter 410_1 so as to receive the serial signal SSC, and outputs the differential signals DTXC and DTXCB (that is, a clock output signal) according to the serial signal SSC. The parallel-to-serial converter 410_2 is coupled to the pattern generator 131 so as to receive a test data DTS 1, and converts the test data DTS 1 to a serial signal SS1. The transmitting driver 420_2 is coupled to the parallel-to-serial converter 4102 so as to receive the serial signal SS1, and outputs the differential signals DTX1 and DTX1B (that is, a test output signal) according to the serial signal SS1.

The parallel-to-serial converter 410_3 is coupled to the pattern generator 131 so as to receive a test data DTS2, and converts the test data DTS2 to a serial signal SS2. The transmitting driver 420_3 is coupled to the parallel-to-serial converter 410_3 so as to receive the serial signal SS2, and outputs the differential output signals DTX2 and DTX2B (that is, a test output signal) according to the serial signal SS2. The parallel-to-serial converter 410_4 is coupled to the pattern generator 131 so as to receive test data DTS3, and converts the test data DTS3 to a serial signal SS3, and then outputs the differential signals DTX3 and DTX3B (that is, a test output signal) according to the serial signal SS3.

In the content of the specification of the application (including the following claims), the use of a term "couple", "coupling", and "coupled" refer to any direct or indirect connections. For instance, if a first apparatus is described to be coupled to a second apparatus in the context, it should be construed as that the first apparatus is directly connected to the second apparatus, or the first apparatus is indirectly connected to the second apparatus through other apparatuses or any other means.

In summary, a differential signal transmission circuit having a self-test capability is described in the aforementioned embodiments. In detail, in the differential signal transmission circuit of the embodiments mentioned above, the LVDS transmitter may adjust the effective number of input bits of the LVDS transmitter to conform to the TMDS, so as to generate the test input signals which are configured to test the TMDS receiver. In other words, the additional TMDS transmitter configuration is no required for testing; therefore, the hardware costs of the TMDS transmitter may be omitted. Furthermore, in the differential signal transmission circuit of the embodiments mentioned above, the TMDS receiver may adjust the data capturing rate of the test input signals so as to conform to the data bit rate of the LVDS transmitter. Furthermore, there is a test circuit configured within the differential signal transmission circuit of the embodiment, which may determine whether or not the TMDS receiver receives correctly. In the configuration mentioned above, the differential signal transmission circuit implements a self-test capability, so as to omit the testing costs of utilizing the test machines.

Although the present invention has been described with reference to the above embodiments, however, the present invention is not limited thereto. It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A differential signal transmission circuit, comprising:
   a pattern generator, configured to generate a plurality of test data;
   a low voltage differential signal (LVDS) transmitter, coupled to the pattern generator to receive the test data, and generating a test output signal according to the test data;
   a transition minimized differential signal (TMDS) receiver, configured to receive a test input signal, and to output a plurality of decoded data; and
   a comparator, coupled to the TMDS receiver to receive the decoded data, and coupled to the pattern generator to receive the test data, wherein the comparator compares the decoded data with the test data, to output a test result of the TMDS receiver, and the LVDS transmitter adjusts an effective number of input bits of the LVDS transmitter to conform to the TMDS.

2. The differential signal transmission circuit as claimed in claim 1, wherein during a test period, the LVDS transmitter is coupled to the TMDS receiver, so that the test output signal is to be the test input signal.

3. The differential signal transmission circuit as claimed in claim 1, wherein a data cycle of the test output signal is 2n times of a typical TMDS, wherein n is an integer.

4. The differential signal transmission circuit as claimed in claim 1, wherein the TMDS receiver adjusts a data capturing rate of the test input signal, to conform to a data bit rate of the LVDS transmitter.

5. The differential signal transmission circuit as claimed in claim 4, wherein the TMDS receiver adjusts the data capturing rate of the test input signal by removing part of repeated data of the test input signals.

6. The differential signal transmission circuit as claimed in claim 1, wherein the LVDS transmitter comprises:
a parallel-to-serial converter, coupled to the pattern generator, and configured to convert the test data into a serial signal; and
a transmitting driver, coupled to the parallel-to-serial converter, and to output the test output signal according to the serial signal.

7. The differential signal transmission circuit as claimed in claim 6, wherein an effective number of input bits of the parallel-to-serial converter is adjusted to conform to the TMDS.

8. The differential signal transmission circuit as claimed in claim 1, wherein the TMDS receiver comprises:
an analog front end (AFE) processor, configured to receive the test input signal, and to output a plurality of initial data;
a digital decimator, coupled to the analog front end processor, and decimating the initial data to output a plurality of decimated data; and
a TMDS decoder, coupled to the digital decimator, and output the decoded data according to the decimated data.

9. The differential signal transmission circuit as claimed in claim 8, wherein during the decimation of the digital decimator, a repeated data within the initial data is removed.

10. The differential signal transmission circuit as claimed in claim 8, wherein a number of the initial data is 2n times of the decimated data, wherein n is an integer.

11. The differential signal transmission circuit as claimed in claim 8, wherein the TMDS receiver further comprises:
a buffer, coupled between the digital decimator and the TMDS decoder, and reorganizing the decimated data.

12. The differential signal transmission circuit as claimed in claim 8, wherein a data interval between each of the initial data captured by the digital decimator is the same.

13. A differential signal transmission circuit, comprising:
a low voltage differential signal (LVDS) transmitter, configured to receive a plurality of test data, and to generate a plurality of test output signals according to the test data;
a transition minimized differential signal (TMDS) receiver, configured to receive a plurality of test input signals, and to output a plurality of decoded data; and
a test circuit, coupled to the LVDS transmitter to generate the test data to the LVDS transmitter, coupled to the TMDS receiver to receive the decoded data, and outputting a test result of the TMDS receiver, wherein
during a test period, the LVDS transmitter may be coupled to the TMDS receiver, so that the test output signals are to be the test input signals, the LVDS transmitter adjusts an effective number of input bits of the LVDS transmitter to conform to the TMDS, and the TMDS receiver adjusts a data capturing rate of the test input signals to conform to a data bit rate of the LVDS transmitter.

14. The differential signal transmission circuit as claimed in claim 13, wherein the test circuit comprises:
a pattern generator, configured to generate the test data;
a comparator, coupled to the TMDS receiver to receive the decoded data, and coupled to the pattern generator to receive the test data, wherein the comparator compares the decoded data with the test data, and output the test result of the TMDS receiver.

15. A differential signal transmission circuit, comprising:
a pattern generator, configured to generate a plurality of test data;
a low voltage differential signal (LVDS) transmitter, comprising:
a parallel-to-serial converter, coupled to the pattern generator, configured to convert the test data into a serial signal; and
a transmitting driver, coupled to the parallel-to-serial converter, and configured to output a test output signal according to the serial signal;
a transition minimized differential signal (TMDS) receiver, comprising:
an analog front end (AFE) processor, configured to receive a test input signal, and to output a plurality of initial data;
a digital decimator, coupled to the analog front end processor, and decimating the initial data to output a plurality of decimated data; and
a TMDS decoder, coupled to the digital decimator, and to output the decoded data according to the decimated data; and
a comparator, coupled to the TMDS receiver to receive the decoded data, and coupled to the pattern generator to receive the test data, wherein the comparator compares the decoded data with the test data, to output a test result of the TMDS receiver, and wherein during a test period, the LVDS transmitter adjusts an effective number of input bits of the LVDS transmitter to conform to the TMDS.

16. The differential signal transmission circuit as claimed in claim 15, wherein during the test period, the LVDS transmitter is coupled to the LVDS receiver, so that the test output signal is to be the test input signal.

* * * * *